United States Patent
Okuda et al.

(10) Patent No.: US 10,640,869 B2
(45) Date of Patent: May 5, 2020

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Kazuyuki Okuda, Toyama (JP); Masayoshi Minami, Toyama (JP); Yoshinobu Nakamura, Toyama (JP); Kosuke Takagi, Toyama (JP); Yukinao Kaga, Toyama (JP); Yuji Takebayashi, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 16/137,331

(22) Filed: Sep. 20, 2018

(65) Prior Publication Data
US 2019/0093222 A1    Mar. 28, 2019

(30) Foreign Application Priority Data

Sep. 28, 2017    (JP) ................................. 2017-188787

(51) Int. Cl.
*C23C 16/455* (2006.01)
*H01L 21/673* (2006.01)
(Continued)

(52) U.S. Cl.
CPC .......... *C23C 16/455* (2013.01); *C23C 16/345* (2013.01); *C23C 16/4587* (2013.01);
(Continued)

(58) Field of Classification Search
CPC ................ C23C 16/455; C23C 16/345; C23C 16/45523; C23C 16/4587; C23C 16/52;
(Continued)

(56) References Cited

U.S. PATENT DOCUMENTS

2011/0318940 A1    12/2011    Ota et al.
2013/0337660 A1    12/2013    Ota et al.
(Continued)

FOREIGN PATENT DOCUMENTS

JP    2004-006801 A    1/2004
JP    2012-033874 A    2/2012
(Continued)

OTHER PUBLICATIONS

Korean Office Action dated Sep. 19, 2019 for the Korean Patent Application No. 10-2018-0112882.
(Continued)

*Primary Examiner* — Selim U Ahmed
(74) *Attorney, Agent, or Firm* — Volpe and Koenig, P.C.

(57) ABSTRACT

A method of manufacturing a semiconductor device, includes: supplying precursor gas into process chamber in which plural substrates are accommodated by sequentially performing: supplying inert gas at first inert gas flow rate from first nozzle into the process chamber; supplying the inert gas at second inert gas flow rate higher than the first inert gas flow rate from the first nozzle into the process chamber while supplying precursor gas from the first nozzle into the process chamber; and supplying the inert gas at the first inert gas flow rate from the first nozzle into the process chamber while the process chamber is evacuated from an upstream side of flow of the precursor gas; stopping supply of the precursor gas; removing the precursor gas remaining in the process chamber; supplying reaction gas from a second nozzle into the process chamber; and removing the reaction gas remaining in the process chamber.

9 Claims, 8 Drawing Sheets

(51) Int. Cl.
  *H01J 37/32* (2006.01)
  *H01L 21/02* (2006.01)
  *C23C 16/52* (2006.01)
  *C23C 16/458* (2006.01)
  *H01L 21/67* (2006.01)
  *C23C 16/34* (2006.01)

(52) U.S. Cl.
  CPC ........ *C23C 16/45523* (2013.01); *C23C 16/52* (2013.01); *H01J 37/32449* (2013.01); *H01L 21/0217* (2013.01); *H01L 21/0228* (2013.01); *H01L 21/02211* (2013.01); *H01L 21/02274* (2013.01); *H01L 21/67017* (2013.01); *H01L 21/67109* (2013.01); *H01L 21/67313* (2013.01); *H01L 21/67326* (2013.01); *H01J 2237/20214* (2013.01); *H01J 2237/24585* (2013.01); *H01J 2237/3321* (2013.01); *H01J 2237/3323* (2013.01); *H01L 21/67248* (2013.01)

(58) Field of Classification Search
  CPC ........... H01L 21/67109; H01L 21/0228; H01L 21/67017; H01L 21/67326; H01L 21/0217; H01L 21/02211; H01L 21/67313; H01L 21/02274; H01L 21/67248; H01J 37/32449; H01J 2237/20214; H01J 2237/24585; H01J 2237/3323; H01J 2237/3321
  See application file for complete search history.

(56) References Cited

U.S. PATENT DOCUMENTS

| | | | |
|---|---|---|---|
| 2014/0084389 | A1 | 3/2014 | Ogawa |
| 2014/0356550 | A1* | 12/2014 | Tonegawa ........... H01J 37/3244 427/569 |
| 2015/0303054 | A1* | 10/2015 | Hanashima ....... H01L 21/02164 438/758 |
| 2017/0087606 | A1 | 3/2017 | Nakamura et al. |

FOREIGN PATENT DOCUMENTS

| | | |
|---|---|---|
| JP | 2014-067877 A | 4/2014 |
| JP | 2014-236069 A | 12/2014 |
| KR | 20130057489 A | 5/2013 |
| KR | 20140141515 A | 12/2014 |
| KR | 20150052219 A | 5/2015 |
| TW | 201512447 A | 4/2015 |
| TW | 201720541 A | 6/2017 |
| WO | 2014/080785 A1 | 1/2017 |

OTHER PUBLICATIONS

Taiwanese Office Action dated Jun. 5, 2019 for the Taiwanese Patent Application No. 107132095.
Japanese Office Action dated Jan. 7, 2020 for the Japanese Patent Application No. 2017-188787.

* cited by examiner

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2017-188787, filed on Sep. 28, 2017, the entire contents of which are incorporated herein by reference.

TECHNICAL FIELD

The present disclosure relates to a method of manufacturing a semiconductor device, a substrate processing apparatus, and a recording medium.

BACKGROUND

In the related art, a film-forming process for forming a film on a substrate accommodated in a process chamber is described as one of the manufacturing processes of a semiconductor device.

In the film-forming process, a precursor gas and a reaction gas are supplied to a process chamber accommodating substrates stacked in the vertical direction, thereby forming a film on each of the stacked substrates. When forming the film on each of the substrates stacked in a vertical direction as described above, the film thickness sometimes varies depending on the positions at which the substrates are disposed.

SUMMARY

The present disclosure provides some embodiments of a technique capable of suppressing inter-substrate variations in film thickness of films formed on substrates stacked in a vertical direction.

According to one embodiment of the present disclosure, there is provided a technique, including:
supplying a precursor gas into a process chamber in which a plurality of substrates are arranged and accommodated by sequentially performing:
supplying an inert gas at a first inert gas flow rate from a first nozzle into the process chamber in a state in which evacuation of the process chamber is substantially stopped;
supplying the inert gas at a second inert gas flow rate higher than the first inert gas flow rate from the first nozzle into the process chamber while supplying a precursor gas stored in a reservoir part from the first nozzle into the process chamber in a state in which evacuation of the process chamber is substantially stopped; and
supplying the inert gas at the first inert gas flow rate from the first nozzle into the process chamber in a state in which the process chamber is evacuated from one end side which is an upstream side of a flow of the precursor gas;
stopping supply of the precursor gas;
removing the precursor gas remaining in the process chamber;
supplying a reaction gas from a second nozzle into the process chamber; and
removing the reaction gas remaining in the process chamber.

DETAILED DESCRIPTION

A method of manufacturing a semiconductor device according to an embodiment of the present disclosure, a substrate processing apparatus, and a program will be described with reference to FIGS. 1 to 8. An arrow UP shown in the figures indicates the upper side of an apparatus. (Overall Configuration of Substrate Processing Apparatus)

Figure 1:
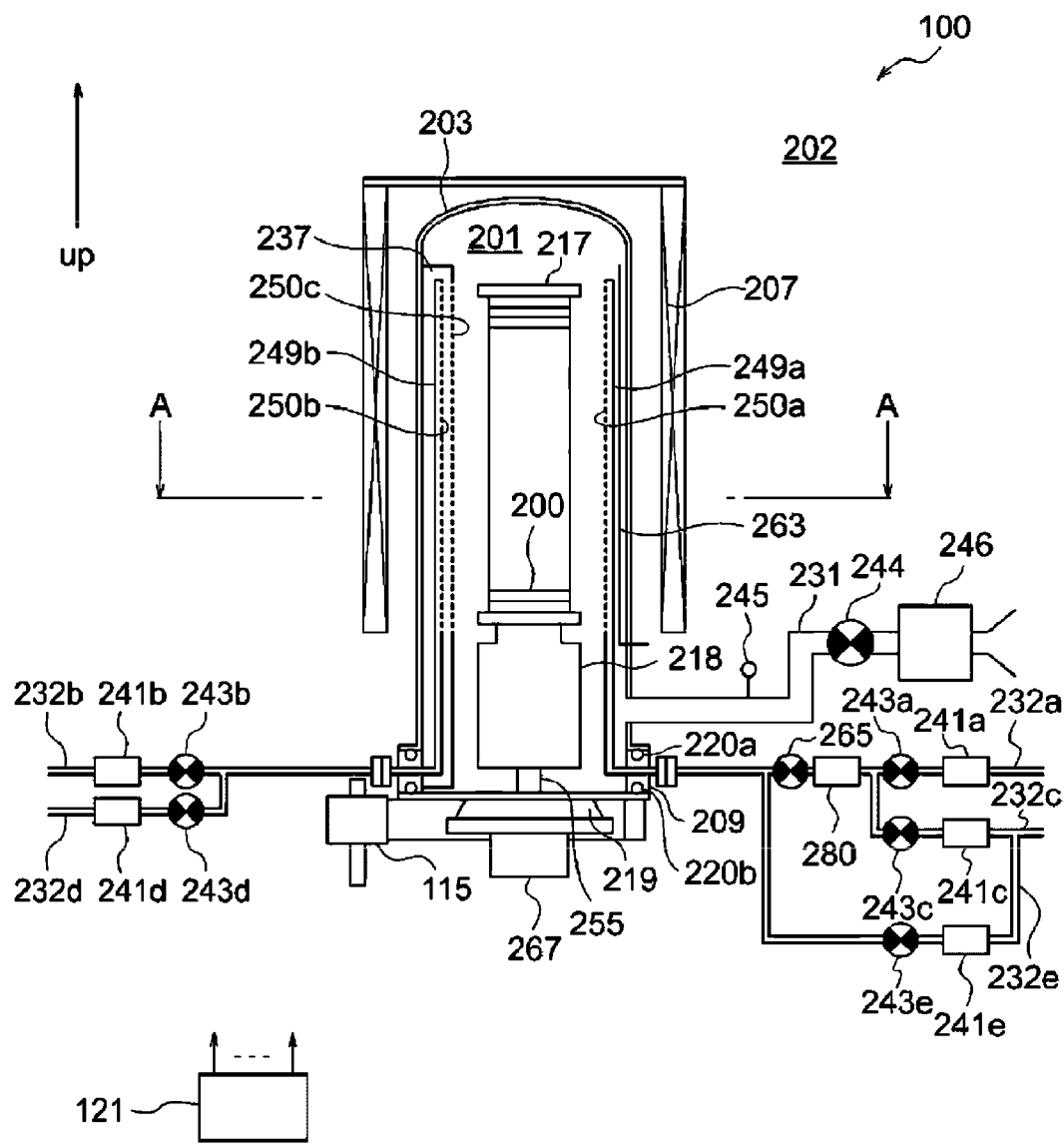
FIG. 1 is a schematic configuration diagram showing a substrate processing apparatus used in a method of manufacturing a semiconductor device according to an embodiment of the present disclosure.

As shown in FIG. 1, the substrate processing apparatus 100 has a process furnace 202 in which a heater 207 as a heating means (heating mechanism) is disposed. The heater 207 has a cylindrical shape and is vertically installed by being supported on a heater base (not shown) as a holding plate.

Inside the heater 207, a reaction tube 203 is arranged concentrically with the heater 207. The reaction tube 203 is made of a heat-resistant material such as, for example, quartz ($SiO_2$) or silicon carbide (SiC), and is formed in a cylindrical shape with its upper end closed and its lower end opened. A manifold (inlet flange) 209 is disposed below the reaction tube 203 concentrically with the reaction tube 203. The manifold 209 is made of a metal such as, for example, stainless steel (SUS) or the like, and is formed in a cylindrical shape with its upper and lower ends opened. The upper end portion of the manifold 209 is engaged with the lower end portion of the reaction tube 203 and is configured to support the reaction tube 203.

An O ring 220a as a seal member is installed between the manifold 209 and the reaction tube 203. As the manifold 209 is supported on the heater base, the reaction tube 203 is vertically installed. A process chamber 201 is formed in the tubular hollow portion of a process container. The process chamber 201 is configured to be able to accommodate a plurality of wafers 200 as substrates in a state in which the wafers 200 are arranged in a horizontal posture in multiple stages in a vertical direction by a boat 217 to be described later.

In the process chamber 201, vertically-extending nozzles 249a (first nozzle) and 249b (second nozzle) are installed so as to penetrate the side wall of the manifold 209. Gas supply pipes 232a and 232b are connected to the nozzles 249a and 249b, respectively. Thus, plural kinds of gases, in this case, two kinds of gases can be supplied into the process chamber 201.

Mass flow controllers (MFC) 241a and 241b as flow rate controllers (flow rate control parts) and valves 243a and 243b as opening/closing valves are respectively installed in the gas supply pipes 232a and 232b sequentially from the upstream sides. Gas supply pipes 232c and 232d for supplying an inert gas are connected to the gas supply pipes 232a and 232b on the downstream of the valves 243a and 243b, respectively. MFCs 241c and 241d as flow rate controllers (flow rate control parts) and valves 243c and 243d as opening/closing valves are installed in the gas supply pipes 232c and 232d sequentially from the upstream sides.

In the gas supply pipe 232a, on the downstream side of the connection portion to which the gas supply pipe 232c is connected, a reservoir part (tank) 280 for storing a precursor gas and a valve 265 are installed in the named order from the upstream side. A gas supply pipe 232e branched from the gas supply pipe 232c is connected to the gas supply pipe 232a on the downstream side of the valve 265. In the gas supply pipe 232e, an MFC 241e as a flow rate controller (flow rate control part) and a valve 243e as an opening/closing valve are installed in the named order from the upstream side.

Figure 2:
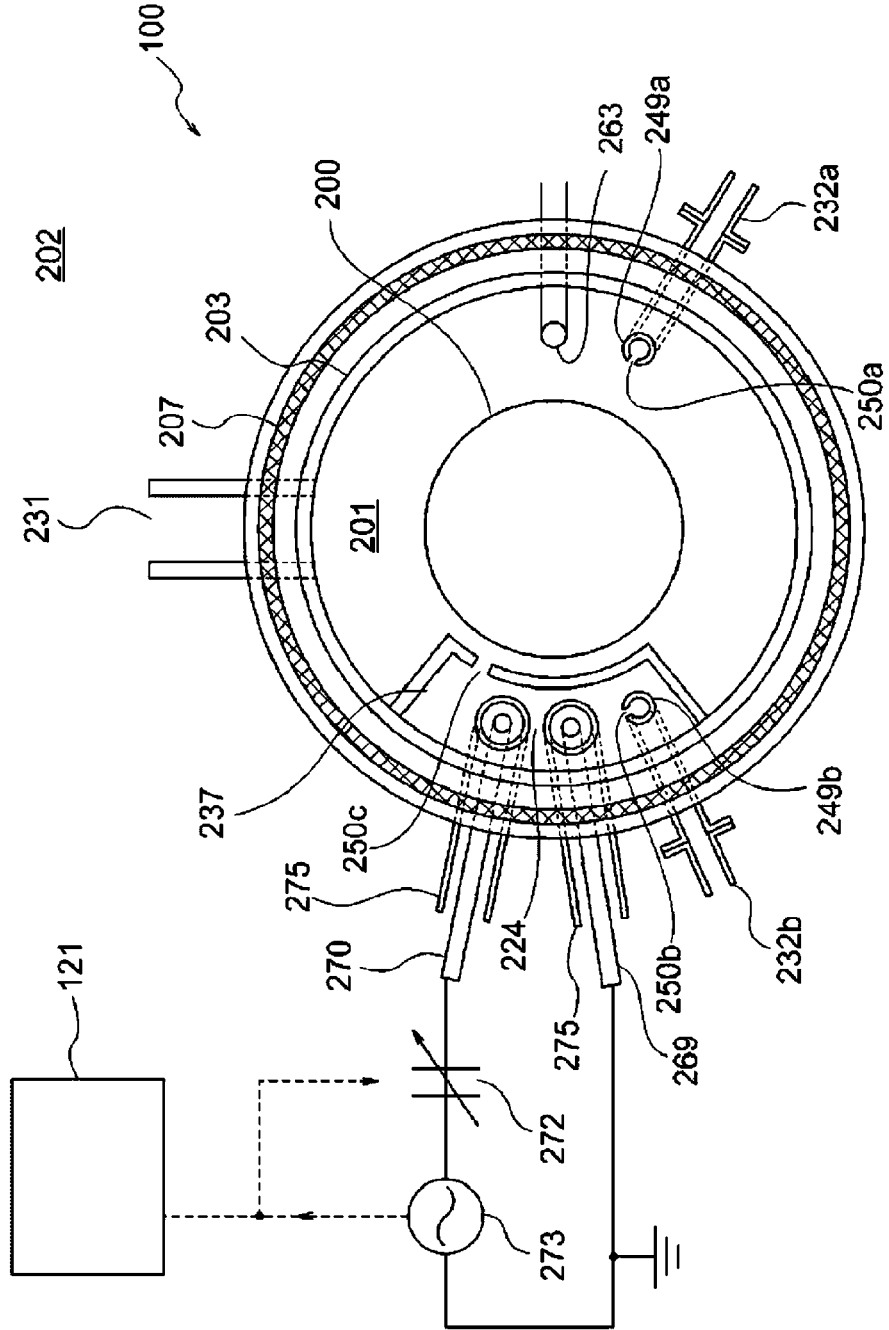
FIG. 2 is a sectional view taken along line A-A in FIG. 1, showing a substrate processing apparatus used in a method of manufacturing a semiconductor device according to an embodiment of the present disclosure.

A nozzle 249a is connected to a distal end portion of the gas supply pipe 232a. As shown in FIG. 2, the nozzle 249a is installed in an annular space between an inner wall of the reaction tube 203 and the wafers 200 so as to extend upward in a stacking direction of the wafers 200 (in the vertical direction) from the lower portion to the upper portion of the inner wall of the reaction tube 203. That is, the nozzle 249a is installed on a lateral side of a wafer arrangement region where the wafers 200 are arranged. The nozzle 249a is configured as an L-shaped long nozzle. The horizontal portion of the nozzle 249a is installed so as to penetrate the side wall of the manifold 209, and the vertical portion of the nozzle 249a is installed so as to extend upward at least from one end side to the other end side of the wafer arrangement region. Gas supply holes 250a for supplying a gas are formed on the side surface of the nozzle 249a. The gas supply holes 250a are opened so as to face a center of the reaction tube 203 and are capable of supplying a gas toward the wafers 200. The gas supply holes 250a are arranged from the lower portion to the upper portion of the reaction tube 203. The gas supply holes 250a have the same opening area and are formed at the same opening pitch.

A nozzle 249b is connected to a distal end portion of the gas supply pipe 232b. The nozzle 249b is installed in a buffer chamber 237 which is a gas dispersion space. As shown in FIG. 2, the buffer chamber 237 is installed along the stacking direction of the wafers 200 in the annular space between the inner wall of the reaction tube 203 and the wafers 200 and in the portion extending from the lower portion to the upper portion inside the process chamber 201. That is, the buffer chamber 237 is installed in a region existing on the lateral side of the wafer arrangement region and horizontally surrounding the wafer arrangement region.

Gas supply holes 250c for supplying a gas are formed in an end portion of the wall of the buffer chamber 237 adjacent to the wafers 200. The gas supply holes 250c are opened so as to face the center of the reaction tube 203 and are capable of supplying a gas toward the wafers 200. The gas supply holes 250c are arranged from the lower portion to the upper portion of the reaction tube 203. The gas supply holes 250c have the same opening area and are formed at the same opening pitch.

The nozzle 249b is installed in the end portion of the buffer chamber 237 opposite to the end portion where the gas supply holes 250c are formed. The nozzle 249b is installed to extend upward in the stacking (arrangement) direction of the wafers 200 from the lower portion to the upper portion of the inner wall of the reaction tube 203. That is, the nozzle 249b is installed on the lateral side of the wafer arrangement region where the wafers 200 are arranged. The nozzle 249b is configured as an L-shaped long nozzle. The horizontal portion of the nozzle 249b is installed so as to penetrate the side wall of the manifold 209, and the vertical portion of the nozzle 249b is installed so as to extend upward at least from one end side to the other end side of the wafer arrangement region. Gas supply holes 250b for supplying a gas are formed on the side surface of the nozzle 249b. The gas supply holes 250b are opened so as to face the center of the buffer chamber 237. Similar to the gas supply holes 250c, the gas supply holes 250b are arranged from the lower portion to the upper portion of the reaction tube 203.

By adjusting the opening area and the opening pitch of each of the gas supply holes 250b from the upstream side to the downstream side as described above, it is possible to inject a gas from the gas supply holes 250b at different flow velocities and at a substantially equal flow rate. Then, by introducing the gas injected from the gas supply holes 250b into the buffer chamber 237, it is possible to equalize the different gas flow velocities in the buffer chamber 237.

As described above, in the present embodiment, the gas is carried via the nozzles 249a and 249b and the buffer chamber 237 which are arranged in the vertically elongated annular space, i.e., the cylindrical space defined by the inner wall of the reaction tube 203 and the end portions of the stacked wafers 200.

The gas is initially injected into the process chamber 201 in the vicinity of the wafers 200 from the gas supply holes 250a to 250c opened in the nozzles 249a and 249b and the buffer chamber 237. The direction of the main flow of the gas in the process chamber 201 is set to a direction parallel to the surfaces of the wafers 200, i.e., a horizontal direction. With such a configuration, it is possible to uniformly supply the gas to each of the wafers 200 and to improve the uniformity of the film thickness of the film formed on each of the wafers 200. The gas flowing on the surfaces of the wafers 200, i.e., the residual gas after reaction, flows toward the exhaust port, i.e., in the direction of the exhaust pipe 231 described later. However, the direction of the flow of the residual gas is appropriately specified depending on the position of the exhaust port and is not limited to the vertical direction.

From the gas supply pipe 232a, a silicon-based precursor gas, for example, a dichlorosilane ($SiH_2Cl_2$, abbreviation: DCS) gas as a chlorosilane-based precursor gas in the present embodiment, is supplied into the process chamber 201 via the MFC 241*a*, the valve 243*a*, the gas supply pipe 232*a*, the reservoir part 280, the valve 265 and the nozzle 249*a* as shown in FIG. 1.

The silicon-based precursor gas is a gaseous silicon-based precursor, for example, a gas obtained by vaporizing a silicon-based precursor which is kept in a liquid state at a room temperature and an atmospheric pressure, or a silicon-based precursor staying in a gaseous state at a room temperature and an atmospheric pressure. As used herein, the term "precursor" may mean a "liquid precursor staying in a liquid state", a "precursor gas staying in a gaseous state", or both.

From the gas supply pipe 232*b*, a reaction gas, for example, an ammonia ($NH_3$) gas as a nitrogen-containing gas in the present embodiment, is supplied into the process chamber 201 via the MFC 241*b*, the valve 243*b*, the gas supply pipe 232*b*, the nozzle 249*b* and the buffer chamber 237.

From the gas supply pipe 232*c*, an inert gas, for example, a nitrogen ($N_2$) gas in the present embodiment, is supplied into the process chamber 201 via the MFC 241*c*, the valve 243*c*, the reservoir part 280, the valve 265 and the gas supply pipe 232*a*.

From the gas supply pipe 232*e*, an inert gas, for example, a nitrogen ($N_2$) gas in the present embodiment, is supplied into the process chamber 201 via the MFC 241*e*, the valve 243*e* and the gas supply pipe 232*a*.

From the gas supply pipe 232*d*, an inert gas, for example, a nitrogen ($N_2$) gas in the present embodiment, is supplied into the process chamber 201 via the MFC 241*d*, the valve 243*d*, the gas supply pipe 232*b* and the buffer chamber 237.

In the case of supplying the aforementioned gases from the respective gas supply pipes, a precursor supply system for supplying a precursor containing a predetermined element, i.e., a chlorosilane-based precursor gas supply system as a precursor gas supply system (silicon-based precursor gas supply system) is mainly constituted by the gas supply pipe 232*a*, the MFC 241*a*, the valve 243*a*, the reservoir part 280 and the valve 265. The nozzle 249*a* may be included in the chlorosilane-based precursor gas supply system. The chlorosilane-based precursor gas supply system may also be referred to as a chlorosilane-based precursor gas system.

Further, a reaction gas supply system for supplying a reaction gas, i.e., a nitrogen-containing gas supply system for supplying a nitrogen-containing gas as a reaction gas is mainly constituted by the gas supply pipe 232*b*, the MFC 241*b* and the valve 243*b*. The nozzle 249*b* and the buffer chamber 237 may be included in the nitrogen-containing gas supply system. The nitrogen-containing gas supply system may also be referred to as a nitrogen-containing gas system.

Further, an inert gas supply system is mainly constituted by the gas supply pipes 232*c*, 232*d* and 232*e*, the MFCs 241*c*, 241*d* and 241*e*, and the valves 243*c*, 243*d* and 243*e*.

In the buffer chamber 237, as shown in FIG. 2, two rod-shaped electrodes 269 and 270 made of a conductor and having an elongated structure are arranged to extend from the lower portion to the upper portion of the reaction tube 203 along the stacking direction of the wafers 200. Each of the rod-shaped electrodes 269 and 270 is installed in parallel with the nozzle 249*b*. Each of the rod-shaped electrodes 269 and 270 is protected by being covered with the electrode protection pipe 275 from the upper portion to the lower portion. One of the rod-shaped electrodes 269 and 270 is connected to a high-frequency power supply 273 via a matcher 272, and the other is connected to the ground which is a reference potential. Plasma is generated in a plasma generation region 224 between the rod-shaped electrodes 269 and 270 by applying high-frequency (RF) power to between the rod-shaped electrodes 269 and 270 from the high-frequency power supply 273 via the matcher 272. A plasma source as a plasma generator (plasma generation part) is mainly constituted by the rod-shaped electrodes 269 and 270 and the electrode protection pipes 275. As will be described later, the plasma source functions as an activation mechanism (excitation part) for activating (exciting) a gas into a plasma state.

As shown in FIG. 1, an exhaust pipe 231 for exhausting the atmosphere inside the process chamber 201 is connected to the reaction tube 203. One end of the exhaust pipe 231 is connected to the exhaust port at a lower end portion of the process chamber 201. A vacuum pump 246 as an exhaust device is connected to the exhaust pipe 231 via a pressure sensor 245 serving as a pressure detector (pressure detection part) for detecting the pressure inside the process chamber 201 and an APC (Auto Pressure Controller) valve 244 serving as an exhaust valve (pressure regulation part). The APC valve 244 is a valve configured so that the evacuation of the inside of the process chamber 201 and the evacuation stoppage can be performed by opening and closing the valve while operating the vacuum pump 246, and the pressure inside the process chamber 201 can be regulated by adjusting the opening degree of the valve based on the pressure information detected by the pressure sensor 245 while operating the vacuum pump 246. An evacuation system is mainly constituted by the exhaust pipe 231, the APC valve 244 and the pressure sensor 245. The vacuum pump 246 may be included in the evacuation system.

A seal cap 219 as a furnace opening lid capable of airtightly closing a lower end opening of the manifold 209 is installed below the manifold 209. The seal cap 219 is configured to be brought into contact with the lower end of the manifold 209 from the lower side in the vertical direction. The seal cap 219 is made of a metal such as, for example, stainless steel or the like, and is formed in a disc shape. On the upper surface of the seal cap 219, there is installed an O ring 220*b* as a seal member which abuts against the lower end of the manifold 209. On the opposite side of the seal cap 219 from the process chamber 201, there is installed a rotation mechanism 267 for rotating a boat 217 to be described later. The rotating shaft 255 of the rotation mechanism 267 extends through the seal cap 219 and is connected to the boat 217. The rotation mechanism 267 is configured to rotate the wafers 200 by rotating the boat 217. The seal cap 219 is configured to be raised and lowered in the vertical direction by a boat elevator 115 as an elevating mechanism installed vertically outside the reaction tube 203. The boat elevator 115 is configured to move the boat 217 into and out of the process chamber 201 by raising and lowering the seal cap 219. The boat elevator 115 is configured as a transfer device (transfer mechanism) for transferring the boat 217 and the wafers 200 supported by the boat 217 into and out of the process chamber 201.

The boat 217 as a substrate support tool is configured so as to support a plurality of wafers 200, for example, 25 to 200 wafers 200 in a horizontal posture and in multiple stages in a vertically-aligned state with their centers aligned with one another, i.e., so as to arrange the wafers 200 at intervals. The boat 217 is made of a heat-resistant material such as, for example, quartz or SiC. A heat insulating member 218 made of a heat-resistant material such as, for example, quartz or SiC is installed in the lower portion of the boat 217.

In the process chamber 201, there is installed a temperature sensor 263 as a temperature detector. By adjusting the degree of power supply to the heater 207 based on the temperature information detected by the temperature sensor 263, the temperature inside the process chamber 201 is controlled to have a desired temperature distribution. The temperature sensor 263 is formed in an L-like shape just like the nozzles 249a and 249b and is installed along the inner wall of the reaction tube 203.

Figure 3:
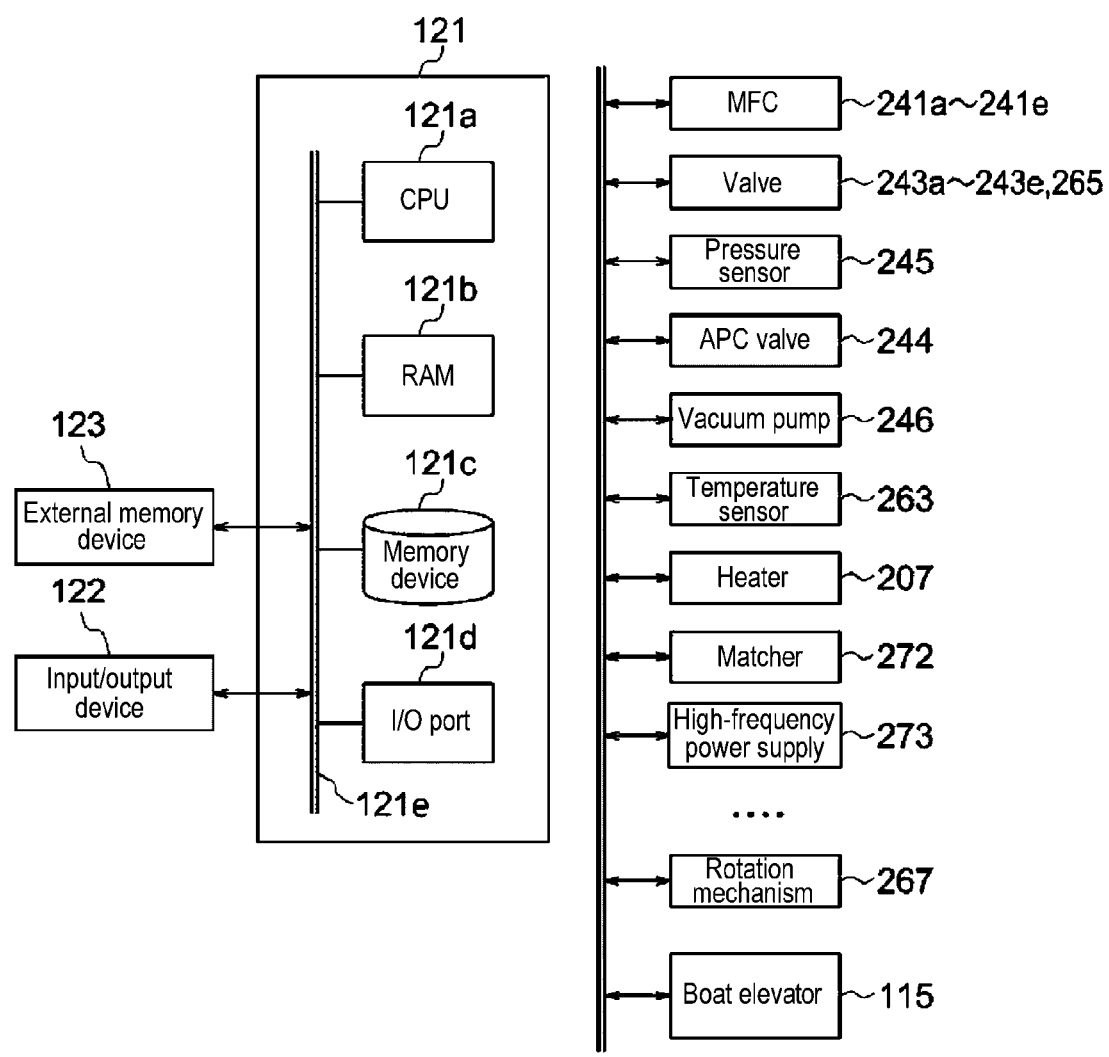
FIG. 3 is a block diagram for explaining a controller provided in a substrate processing apparatus used in a method of manufacturing a semiconductor device according to an embodiment of the present disclosure.

As shown in FIG. 3, the controller 121 as a control part (control means) is configured as a computer including a CPU (Central Processing Unit) 121a, a RAM (Random Access Memory) 121b, a memory device 121c and an I/O port 121d. The RAM 121b, the memory device 121c and the I/O port 121d are configured to exchange data with the CPU 121a via an internal bus 121e. An input/output device 122 formed of, for example, a touch panel or the like is connected to the controller 121.

The memory device 121c is configured by, for example, a flash memory, a hard disc drive (HDD), or the like. A control program for controlling the operations of the substrate processing apparatus, a process recipe in which sequences and conditions of substrate processing such as a film formation to be described later are written, and the like are readably stored in the memory device 121c. The process recipe functions as a program for causing the controller 121 to execute each sequence in a substrate processing process such as a film-forming process or the like, which will be described later, to obtain a predetermined result. Hereinafter, the process recipe and the control program will be generally and simply referred to as a "program."

The I/O port 121d is connected to the MFCs 241a to 241e, the valves 243a to 243e and 265, the pressure sensor 245, the APC valve 244, the vacuum pump 246, the temperature sensor 263, the heater 207, the rotation mechanism 267, the boat elevator 115, the matcher 272, the high-frequency power supply 273, and the like.

The CPU 121a is configured to read the control program from the memory device 121c and execute the same. The CPU 121a is also configured to read the process recipe from the memory device 121c in response to an input of an operation command from the input/output device 122. The CPU 121a is configured to control, according to the contents of the process recipe thus read, the flow rate adjusting operation of various gases by the MFCs 241a to 241e, the opening/closing operation of the valves 243a to 243e and 265, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of raising and lowering the boat 217 with the boat elevator 115, the impedance adjusting operation by the matcher 272, the power supply operation of the high-frequency power supply 273, and the like.

The controller 121 is not limited to being configured as a dedicated computer, but may be configured as a general-purpose computer. For example, the controller 121 of the present embodiment may be configured by preparing an external memory device (for example, a magnetic tape, a magnetic disk such as a flexible disk, a hard disk or the like, an optical disk such as a CD, a DVD or the like, a magneto-optical disk such as an MO or the like, a semiconductor memory such as a USB memory or a memory card) 123 which stores the aforementioned program, and installing the program in a general-purpose computer using the external memory device 123. However, the means for supplying the program to the computer is not limited to the case where the program is supplied via the external memory device 123. For example, the program may be supplied using a communication means such as the Internet or a dedicated line without going through the external memory device 123. The memory device 121c and the external memory device 123 are configured as a computer-readable non-transitory recording medium.

Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123.

(Film Forming Process)

Next, as a manufacturing process (manufacturing method) of a semiconductor device, a film-forming sequence for forming a film on the wafer 200 using the substrate processing apparatus 100 described above will be specifically described with reference to FIGS. 4 to 5. In the following description, the operations of the respective parts constituting the substrate processing apparatus 100 are controlled by the controller 121.

[Wafer Charging and Boat Loading]

After a plurality of wafers 200 is charged into the boat 217 (wafer charging), as shown in FIG. 1, the boat 217 supporting the wafers 200 is lifted by the boat elevator 115 and is loaded into the process chamber 201 (boat loading). In this state, the seal cap 219 seals the lower end of the manifold 209 via the O ring 220b.

When the term "wafer" is used herein, it may refer to "a wafer itself" or "a laminated body (aggregate) of a wafer and a predetermined layer or film formed on the surface of the wafer." That is to say, a wafer including a predetermined layer or film formed on its surface may be referred to as a wafer. In addition, when the phrase "a surface of a wafer" is used herein, it may refer to "a surface (exposed surface) of a wafer itself" or "a surface of a predetermined layer or film formed on a wafer", namely "an uppermost surface of the wafer as a laminated body."

Accordingly, in the present disclosure, the expression "a predetermined gas is supplied to a wafer" may mean that "a predetermined gas is directly supplied to a surface of a wafer itself" or that "a predetermined gas is supplied to a layer or film formed on a wafer, namely to an uppermost surface of a wafer as a laminated body." Furthermore, in the present disclosure, the expression "a predetermined layer (or film) is formed on a wafer" may mean that "a predetermined layer (or film) is directly formed on a surface of a wafer itself" or that "a predetermined layer (or film) is formed on a layer or film formed on a wafer, namely on an uppermost surface of a wafer as a laminated body."

[Pressure Regulation and Temperature Adjustment]

Evacuation is performed by the vacuum pump 246 so that the pressure inside the process chamber 201, i.e., the pressure in the space where the wafers 200 exist, becomes a desired pressure (degree of vacuum). At this time, the pressure inside the process chamber 201 is measured by the pressure sensor 245, and the APC valve 244 is feedback controlled based on the measured pressure information (pressure regulation). The vacuum pump 246 maintains a constantly operated state at least until the processing on the wafers 200 is completed.

Further, the wafers 200 in the process chamber 201 are heated by the heater 207 so as to have a desired temperature. At this time, based on the temperature information detected by the temperature sensor 263, the degree of power supply to the heater 207 is feedback controlled so that the inside of the process chamber 201 has a desired temperature distribution (temperature adjustment). The heating of the inside of the process chamber 201 by the heater 207 is continuously performed at least until the processing on the wafers 200 is completed. However, when processing the wafers 200 at a room temperature, the heating of the inside of the process chamber 201 by the heater 207 may not be performed.

Subsequently, the rotation of the boat 217 and the wafers 200 by the rotation mechanism 267 is started. The rotation of the boat 217 and the wafers 200 by the rotation mechanism 267 is continued at least until the processing on the wafers 200 is completed.

[Film Formation on Wafer]
[Supply of DCS Gas]

First, a step of supplying a DCS gas to the process chamber 201 will be described. In the step of supplying the DCS gas to the process chamber 201, there are sequentially performed a step of supplying an $N_2$ gas from the nozzle 249a extending in the vertical direction to the process chamber 201 at a first inert gas flow rate in a state in which the evacuation of the process chamber 201 accommodating the wafers 200 is substantially stopped, a step of supplying an $N_2$ gas from the nozzle 249a to the process chamber 201 at a second inert gas flow rate higher than the first inert gas flow rate while supplying a DCS gas stored in the reservoir part 280 from the nozzle 249a to the process chamber 201 in a state in which the evacuation of the process chamber 201 is substantially stopped, and a step of supplying an $N_2$ gas from the nozzle 249a to the process chamber 201 at the first inert gas flow rate in a state in which the inside of the process chamber 201 is evacuated from below.

Figure 4:
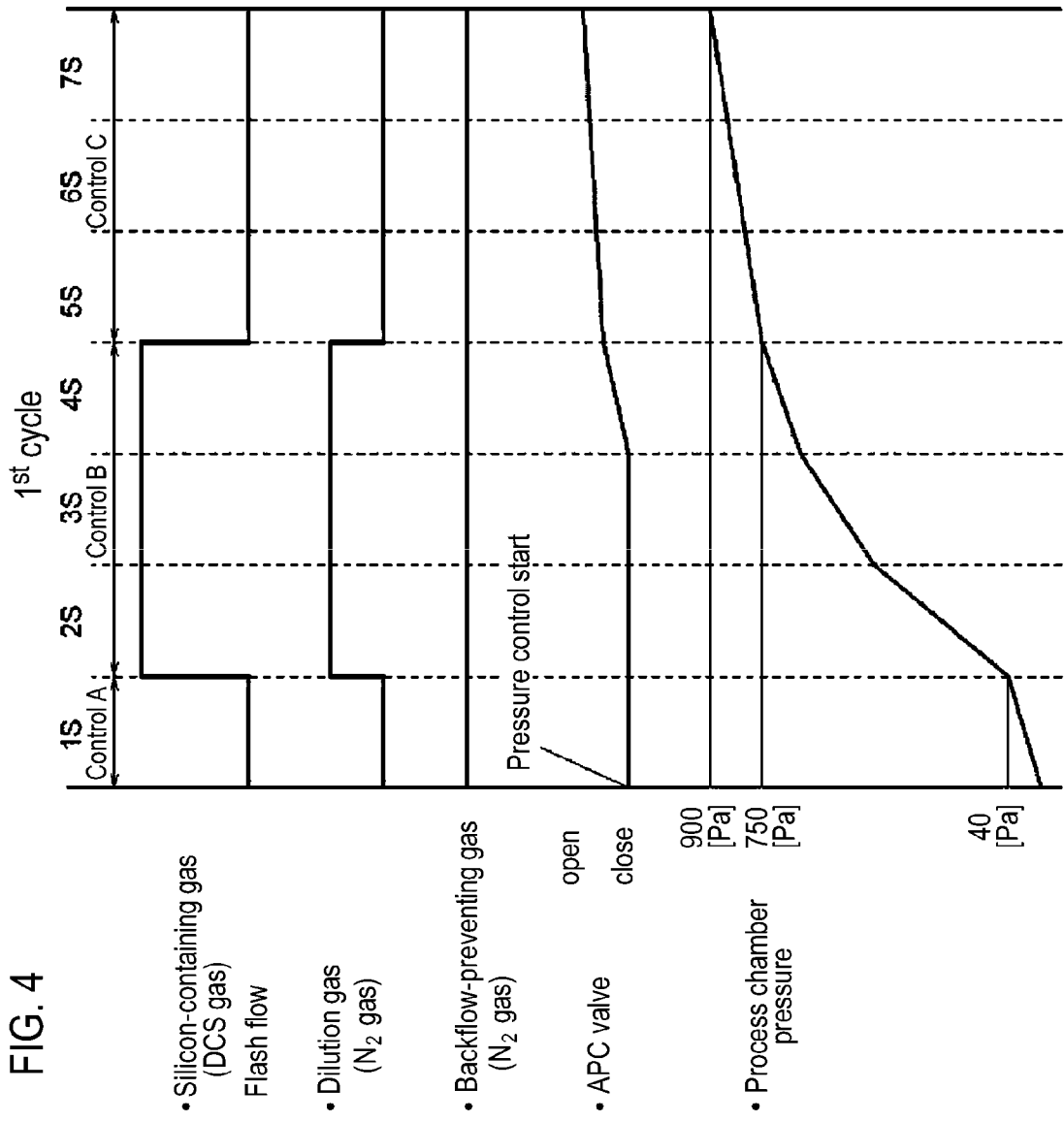
FIG. 4 is a view showing operation timings of respective parts in a film-forming sequence of a method of manufacturing a semiconductor device according to an embodiment of the present disclosure.
Figure 5:
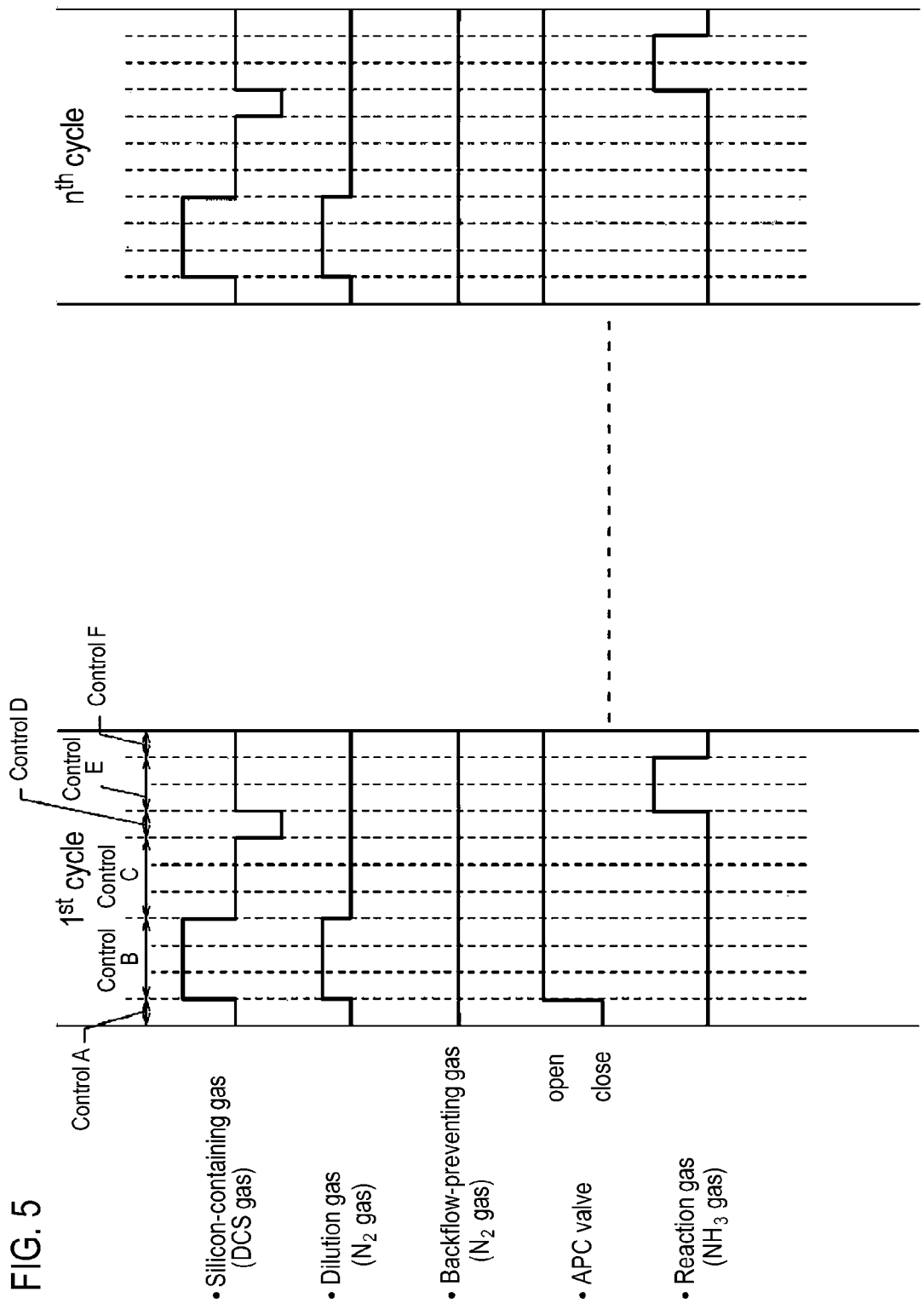
FIG. 5 is a view showing operation timings of respective parts in a film-forming sequence of a method of manufacturing a semiconductor device according to an embodiment of the present disclosure.

Step of Supplying an $N_2$ Gas at the First Inert Gas Flow Rate to the Process Chamber 201 in a State in which the Evacuation of the Process Chamber 201 is Substantially Stopped The step of supplying an $N_2$ gas from the nozzle 249a extending in the vertical direction to the process chamber 201 at the first inert gas flow rate in a state in which the evacuation of the process chamber 201 accommodating the wafers 200 is substantially stopped is performed, e.g., for 1 second (1 s) in control A of the sequence shown in FIGS. 4 and 5.

In this step, the valve 243a shown in FIG. 1 is opened, the valve 243b is closed, the valve 243c is closed, the valve 243d is opened, the valve 243e is opened, and the valve 265 is closed. Further, the APC valve 244 is closed. By opening the valve 243a and closing the valve 265 in this way, the DCS gas is stored in the reservoir part 280. Further, by opening the valve 243e, the $N_2$ gas is supplied from the nozzle 249a to the process chamber 201 at the first inert gas flow rate (for example, a predetermined value falling within a range of, for example, 0.5 to 3.0 [slm]). Further, by opening the valve 243d, the $N_2$ gas as a backflow preventing gas is supplied from the nozzle 249b to the process chamber 201 at a predetermined flow rate falling within a range of, for example, 0.5 to 5.0 [slm]. Further, by closing the APC valve 244, there is available a state in which the evacuation of the inside of the process chamber 201 is substantially stopped. At this time, the temperature of the heater 207 is set to such a temperature that the temperature of the wafer 200 becomes a value falling within a range of, for example, 300 to 600 degrees C.

As used herein, the expression "a state in which the evacuation of the inside of the process chamber 201 is substantially stopped" means that the APC valve 244 as an exhaust valve is substantially closed to substantially stop the evacuation of the inside of the process chamber 201. The term "substantially stopped" includes the following state. That is, the term "substantially stopped" includes a state in which the APC valve 244 is fully closed to stop the evacuation of the inside of the process chamber 201. The term "substantially stopped" further includes a state in which the APC valve 244 is slightly opened to slightly evacuate the inside of the process chamber 201.

As used herein, the expression "a state in which the APC valve 244 is slightly opened to slightly evacuate the inside of the process chamber 201" refers to a state in which the evacuation amount (evacuation rate) V [sccm] of the inside of the process chamber 201 per unit time is much lower than the supply amount (supply rate) $F_B$ [sccm] of the $N_2$ gas per unit time, i.e., a state in which $F_B$>>V in some embodiments. Specifically, the state in which the APC valve 244 is slightly opened to slightly evacuate the inside of the process chamber 201 includes a state in which the evacuation amount V of the inside of the process chamber 201 per unit time is 10% or less of the supply amount $F_B$ of the $N_2$ gas per unit time.

In this step, it is assumed that the gas is supplied in a state in which the APC valve 244 is fully closed to stop the evacuation of the inside of the process chamber 201.

Step of Supplying an $N_2$ Gas to the Process Chamber 201 at a Second Inert Gas Flow Rate while Supplying a DCS Gas to the Process Chamber The step of supplying an $N_2$ gas from the nozzle 249a to the process chamber 201 at a second inert gas flow rate higher than the first inert gas flow rate while supplying a DCS gas stored in the reservoir part 280 from the nozzle 249a to the process chamber 201 in a state in which the evacuation of the process chamber 201 is substantially stopped, is performed, e.g., for 3 seconds in control B of the sequence shown in FIGS. 4 and 5.

In this step, the valve 243a is closed, the valve 243b is closed, the valve 243c is closed, the valve 243d is opened, the valve 243e is opened, and the valve 265 is opened. Further, the APC valve 244 is closed. By closing the valve 243a and opening the valve 265 in this way, the DCS gas (for example, a predetermined amount falling within a range of 100 to 250 cc) stored in the reservoir part 280 is supplied from the nozzle 249a to the process chamber 201 (so-called flash supply or flash flow). At this time, a large amount of DCS gas is momentarily supplied to the process chamber 201, and a gradually reducing amount of DCS gas is supplied to the process chamber 201. For example, at 2 [s], the DCS gas is supplied to the process chamber 201 at a flow rate falling within a range of 5 to 11 [slm]. The flow rate gradually decreases. At 4 [s], the flow rate becomes a flow rate falling within a range of about 0.2 to 3 [slm]. Furthermore, by opening the valve 243e and controlling the MFC 241e, the $N_2$ gas is supplied from the nozzle 249a to the process chamber 201 at a second inert gas flow rate (for example, a predetermined value falling within a range of 1.5 to 4.5 [slm]) higher than the first inert gas flow rate. Thus, the DCS gas stored in the reservoir part 280 is extruded by the $N_2$ gas and is supplied from the nozzle 249a to the process chamber 201. In addition, by opening the valve 243d, the $N_2$ gas as a backflow preventing gas is supplied from the nozzle 249b to the process chamber 201 at a predetermined flow rate falling within a range of, for example, 1.0 to 5.0 [slm].

In this step, the pressure inside the process chamber 201 rises to about 750 [Pa]. In addition, the APC valve 244 begins to be opened, and the evacuation is started. For example, in FIG. 5, the APC valve 244 begins to be opened from around 4 [s].

Step of Supplying an $N_2$ Gas to the Process Chamber 201 at the First Inert Gas Flow Rate in a State in which the Inside of the Process Chamber 201 is Evacuated The step of supplying an $N_2$ gas from the nozzle 249a to the process chamber 201 at the first inert gas flow rate in a state in which the inside of the process chamber 201 is evacuated, is performed for 3 seconds in control C of the sequence shown in FIGS. 4 and 5.

In this step, the valve 243a is opened, the valve 243b is closed, the valve 243c is closed, the valve 243d is opened, the valve 243e is opened, and the valve 265 is closed. Further, the APC valve 244 is opened to regulate the pressure inside the process chamber 201 to a predetermined value falling within a range of, for example, 700 to 1200 [Pa]. By opening the valve 243a and opening the valve 265 in this way, the DCS gas begins to be stored again in the reservoir part 280. Further, by opening the valve 243e and controlling the MFC 241e, the $N_2$ gas is supplied from the nozzle 249a to the process chamber 201 at a first inert gas flow rate (for example, a predetermined value falling within a range of 1.3 to 1.7 [slm]). Further, by opening the valve 243d, the $N_2$ gas as a backflow prevention gas is supplied from the nozzle 249b to the process chamber 201 at a predetermined flow rate falling within a range of, for example, 1.3 to 1.7 [slm]. In the above description, this step is performed by waiting for the reaction of the DCS gas supplied into the process chamber 201 after performing the step of supplying the DCS gas to the process chamber in a state in which the valve 243a is closed. However, this step may be performed by opening the valve 243a and supplying the DCS gas passed through the reservoir part 280. In that case, the flow rate of the DCS gas flowing in the step of supplying the DCS gas to the process chamber in a state in which the valve 243a is closed may be referred to as a first precursor gas flow rate, and the flow rate of the DCS gas in this step performed by opening the valve 243a and supplying the DCS gas passed through the reservoir part 280 may be referred to as a second precursor gas flow rate (for example, a predetermined value falling within a range of 0.5 to 2.0 [slm]).

In this step, the pressure inside the process chamber 201 rises from, for example, 750 [Pa] to about 900 [Pa].

By supplying the DCS gas to the process chamber 201 as described above, the formation of a Si-containing layer as a first layer on the wafer 200 (the base film on the surface) is started. The Si-containing layer may be a Si layer, a DCS gas adsorption layer, or both.

[Removal of DCS Gas]

DCS Gas Removal Step

A step of removing the DCS gas remaining in the process chamber 201 is performed by in control D of the sequence shown in FIG. 5.

In this step, the valve 243a is closed, the valve 243b is closed, the valve 243c is opened, the valve 243d is opened, the valve 243e is opened, and the valve 265 is opened. Further, the APC valve 244 is opened. By opening the valves 243c, 243e and 267 in this way, the $N_2$ gas is supplied from the nozzle 249a to the process chamber 201. In addition, by opening the valve 243d, the $N_2$ gas is supplied from the nozzle 249b to the process chamber 201.

In the step of removing the DCS gas remaining in the process chamber 201 as described above, the APC valve 244 is opened and the gas in the process chamber 201 is exhausted by the vacuum pump 246, whereby the unreacted gas or the gas contributed to the formation of the Si-containing layer, which remains in the process chamber 201, is removed from the process chamber 201 (residual gas removal). However, as long as a sufficient evacuation amount can be obtained, the APC valve 244 may not be fully opened. At this time, the valves 243c and 243d are opened to maintain the supply of the $N_2$ gas into the process chamber 201. The $N_2$ gas acts as a purge gas, whereby the effect of removing the unreacted DCS gas or the DCS gas contributed to the formation of the Si-containing layer, which remains in the process chamber 201, from the process chamber 201 can be enhanced.

At this time, the gas remaining in the process chamber 201 may not be completely removed, and the inside of the process chamber 201 may not be completely purged. If the amount of the gas remaining in the process chamber 201 is very small, there is no adverse effect in the steps performed subsequently. At this time, it is unnecessary to increase the flow rate of the $N_2$ gas to be supplied into the process chamber 201. For example, by supplying the $N_2$ gas substantially at the same amount as the volume of the process chamber 201, it is possible to perform purging such that an adverse effect does not occur in the subsequent steps. By not completely purging the inside of the process chamber 201, it is possible to shorten the purge time and to improve the throughput. In addition, the consumption of the $N_2$ gas can be suppressed to a necessary minimum level.

[Supply of $NH_3$ Gas]

Step of Supplying an $NH_3$ Gas from the Nozzle 249b to the Process Chamber 201

A step of supplying an $NH_3$ gas from the nozzle 249b to the process chamber 201 is performed in control E of the sequence shown in FIG. 5.

In this step, the valve 243a is opened, the valve 243b is opened, the valve 243c is closed, the valve 243d is closed, the valve 243e is opened, and the valve 265 is closed. Further, the APC valve 244 is opened. Moreover, a voltage is applied to between the rod-shaped electrodes 269 and 270. That is, a plasma-excited gas is supplied to the process chamber 201.

By opening the valve 243a and closing the valve 265 as described above, the DCS gas is stored in the reservoir part 280. Further, by opening the valve 243e, the $N_2$ gas as a backflow preventing gas is supplied from the nozzle 249a to the process chamber 201. Moreover, by opening the valve 243b, the $NH_3$ gas is supplied from the nozzle 249b to the process chamber 201 at a predetermined flow rate falling within a range of 0.5 to 10 [slm]. In addition, by opening the APC valve 244, the gas in the process chamber 201 is exhausted by the vacuum pump 246. At this time, the temperature of the heater 207 is set to be the same value as when supplying the DCS gas.

As a result, the $NH_3$ gas undergoes a surface reaction (chemisorption) with the Si-containing layer formed on the surface of the wafer 200, whereby a SiN film is formed on the wafer 200.

[Removal of $NH_3$ Gas]

Step of Removing the $NH_3$ Gas Remaining in the Process Chamber 201

A step of removing the $NH_3$ gas remaining in the process chamber 201 is performed in control F of the sequence shown in FIG. 5.

In this step, the valve 243a is opened, the valve 243b is closed, the valve 243c is closed, the valve 243d is opened, the valve 243e is opened, and the valve 265 is closed.

Further, the APC valve 244 is opened. Moreover, the application of the voltage to between the rod-shaped electrodes 269 and 270 is stopped.

By opening the valve 243a and closing the valve 265 as described above, the DCS gas is stored in the reservoir part 280. Further, by opening the valve 243e, the $N_2$ gas is supplied from the nozzle 249a to the process chamber 201. Moreover, by opening the valve 243d, the $N_2$ gas is supplied from the nozzle 249b to the process chamber 201.

By performing one cycle composed of the above-described respective steps at least once (a predetermined number of times), a SiN film having a predetermined composition and a predetermined film thickness can be formed on the wafer 200. In some embodiments, the cycle described above may be repeated a plurality of times (n times). That is, in some embodiments, the thickness of the SiN layer formed per cycle may be set smaller than a desired film thickness, and the above-described cycle is repeated a plurality of times until the desired film thickness is obtained.

At this time, in the steps of control B and control C (the steps of supplying the DCS gas) of the sequence shown in FIG. 4, the supply concentration of the DCS gas is adjusted by changing the exhaust amount of the gas existing in the process chamber 201 and the flow rate (supply amount) of the $N_2$ gas as an inert gas. As a result, the Si concentration and the N concentration can be adjusted, and the composition ratio of the SiN film can be controlled.

By opening the valve 243a and opening the valve 265, the process of storing the DCS gas in the reservoir part 280 is continued until a predetermined amount of DCS gas is stored. For example, the step of supplying the $NH_3$ gas from the nozzle 249b to the process chamber 201 and the step of removing the $NH_3$ gas remaining in the process chamber 201 may be continued.

[Purging and Atmospheric Pressure Restoration]

After the film-forming process for forming the SiN film having a predetermined composition and a predetermined film thickness is performed, the valves 243c, 243d and 243e are opened so that the $N_2$ gas as an inert gas is supplied from the gas supply pipes 232c, 232d and 232e into the process chamber 201 and is exhausted from the exhaust pipe. The $N_2$ gas acts as a purge gas, whereby the inside of the process chamber 201 is purged with the inert gas, and the gas or the reaction byproduct remaining in the process chamber 201 is removed from the process chamber 201 (purging). Thereafter, the atmosphere in the process chamber 201 is replaced with an inert gas (inert gas replacement), and the pressure in the process chamber 201 is restored to an atmospheric pressure (atmospheric pressure restoration).

[Boat Unloading and Wafer Discharging]

Thereafter, the seal cap 219 is lowered by the boat elevator 115, the lower end of the manifold 209 is opened, and the processed wafers 200 are unloaded from the lower end of the manifold 209 to the outside of the reaction tube 203 in a state in which the processed wafers 200 are supported by the boat 217 (boat unloading). Thereafter, the processed wafers 200 are taken out from the boat 217 (wafer discharging).

(Action)

Next, the action of the present embodiment will be described while comparing with a comparative embodiment. First, the parts of the comparative embodiment different from those of the present embodiment will be mainly described.

Comparative Embodiment

Figure 8:
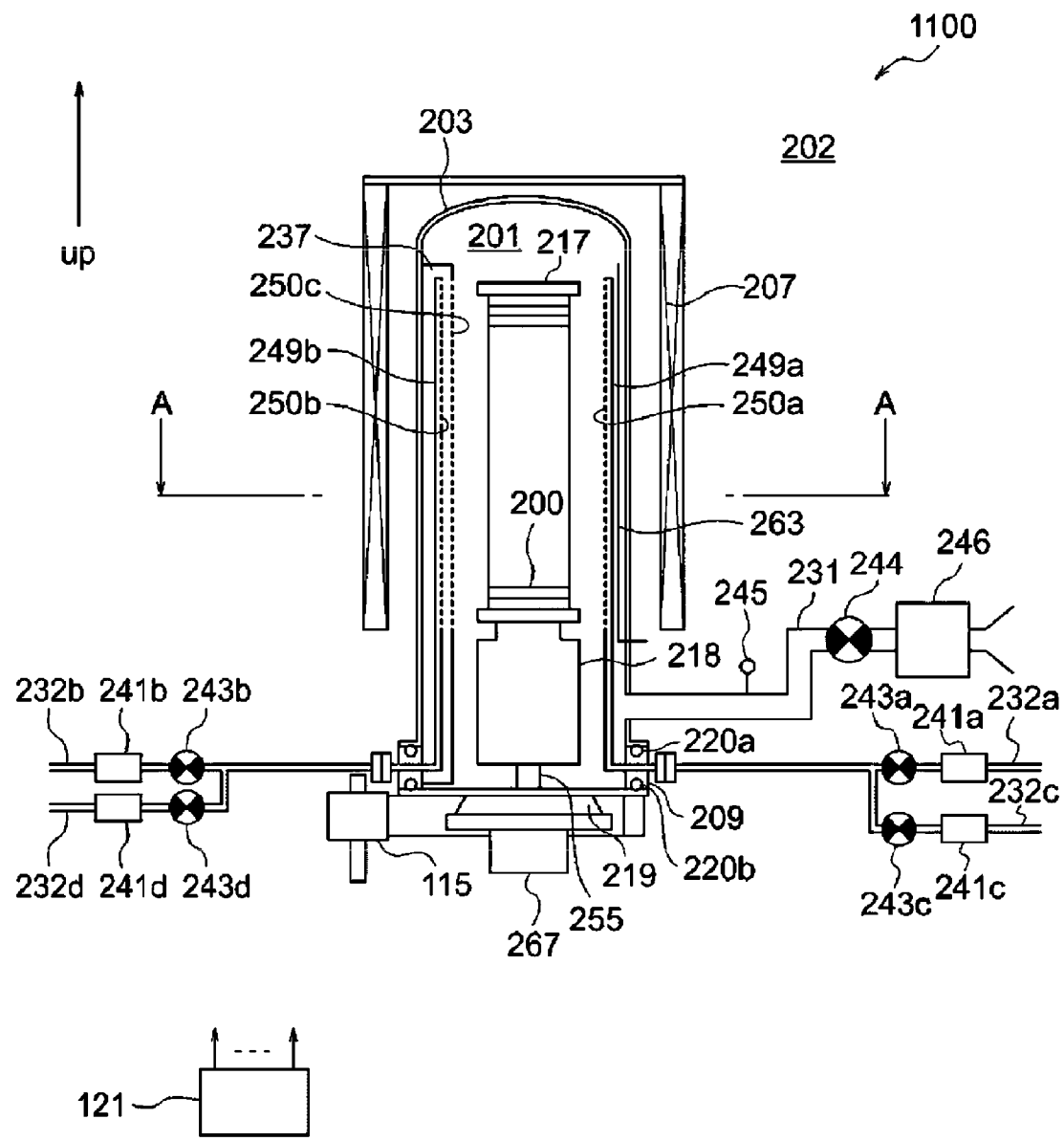
FIG. 8 is a schematic configuration diagram showing a substrate processing apparatus used in a method of manufacturing a semiconductor device according to a comparative embodiment against the embodiment of the present disclosure.

As shown in FIG. 8, the reservoir part 280 and the valve 265 are not installed in the gas supply pipe 232a of the substrate processing apparatus 1100 used in the comparative embodiment. Furthermore, the substrate processing apparatus 1100 is not provided with the gas supply pipe 232e, the MFC 241e and the valve 243e. That is, the $N_2$ gas as a dilution gas for extruding the DCS gas to be supplied to the process chamber 201 is not used.

Action of Present Embodiment

Next, the action of the present embodiment will be described. The action of the manufacturing method of the comparative embodiment will be described by focusing on the parts different in action from those of the present embodiment.

Figure 7:
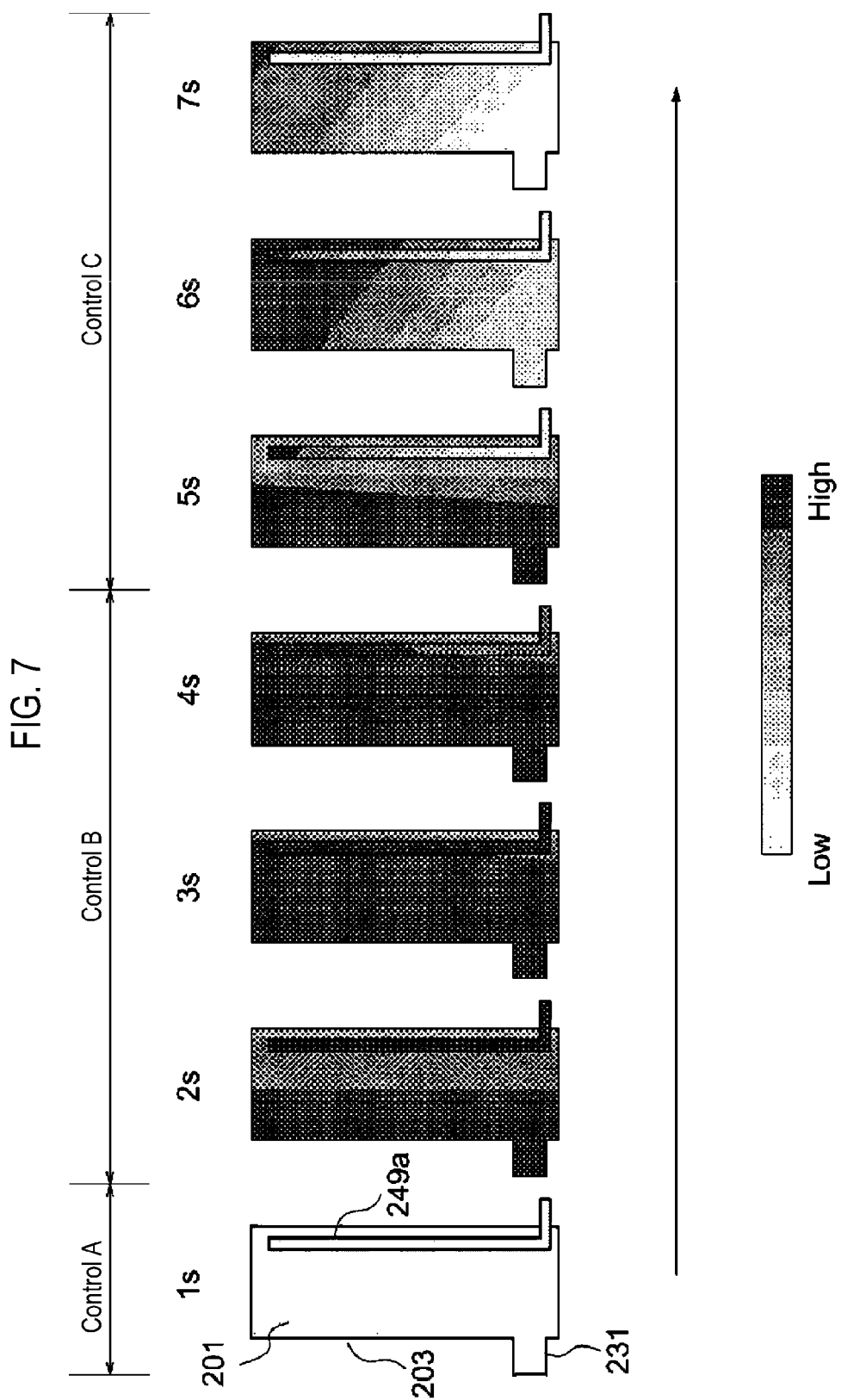
FIG. 7 is a view showing an over-time change in partial pressure of a DCS gas inside a process chamber of a substrate processing apparatus used in a method of manufacturing a semiconductor device according to an embodiment of the present disclosure.

FIG. 7 shows a simulation result of a time-dependent change in the partial pressure of the DCS gas in the process chamber 201 of the substrate processing apparatus 100 used in the present embodiment. The higher the dot density, the higher the partial pressure as compared with the case where the dot density is low. In FIG. 7, the partial pressure of the DCS gas from control A to control C in the sequence shown in FIG. 4 is shown at every lapse of one second. For the sake of convenience, the exhaust pipe 231 is installed on the left side of the reaction tube 203 in the drawing.

In the present embodiment, by closing the valve 243a and opening the valve 265 in control B of the sequence shown in FIG. 4, the DCS gas stored in the reservoir part 280 is supplied from the nozzle 249a to the process chamber 201. Further, by opening the valve 243e and controlling the MFC 241e, the $N_2$ gas is supplied from the nozzle 249a to the process chamber 201 at the second inert gas flow rate higher than the first inert gas flow rate.

In this manner, by performing the stoppage of evacuation of the inside of the process chamber 201 and the supply of a large amount of $N_2$ gas to the process chamber 201 at the same timing, as shown in FIG. 7, the partial pressure of the DCS gas in the process chamber 201 becomes high between 3 [s] and 4 [s] of control B.

Further, by supplying the $N_2$ gas from the nozzle 249a to the process chamber 201 at the second inert gas flow rate higher than the first inert gas flow rate, the DCS gas is pushed up by the $N_2$ gas to the upper end (distal end) of the vertically extending nozzle 249a. Thus, it is possible to suppress an increase in the flow rate of the DCS gas supplied from the lower portion of the nozzle 249a which is the upstream side of the flow of the DCS gas.

In the present embodiment, in the step of supplying the $N_2$ gas to the process chamber 201 at the first inert gas flow rate while evacuating the process chamber 201, which is performed in control C of the sequence shown in FIG. 4, the APC valve 244 is opened so that the gas existing in the process chamber 201 is exhausted by the vacuum pump 246. Further, by opening the valve 243e and controlling the MFC 241e, the $N_2$ gas is supplied from the nozzle 249a to the process chamber 201 at the first inert gas flow rate lower than the second inert gas flow rate.

Further, by exhausting the gas existing in the process chamber 201 from the lower side by the vacuum pump 246, a larger amount of DCS gas is discharged from the lower portion of the process chamber 201 at 5 [s] and 6 [s] of control C. More specifically, for example, in the state in which the exhaust of the gas existing in the process chamber 201 is stopped, a larger amount of DCS gas flows from the lower portion of the nozzle 249a which is the upstream side of the DCS gas flowing through the nozzle 249a. Since the density of the DCS gas in the nozzle 249a decreases toward the upper portion of the nozzle 249a which is the downstream side, the amount of the DCS gas supplied from the upper portion of the nozzle 249a tends to decrease. As described above, the concentration of the DCS gas in the lower portion inside the process chamber 201, where the lower portion of the nozzle 249a which is the upstream side of the DCS gas is disposed, is higher than the concentration of the DCS gas in the upper portion inside the process chamber 201, where the upper portion of the nozzle 249a which is the downstream side of the DCS gas is disposed. However, in the present embodiment, as described above, the gas existing in the process chamber 201 is exhausted from lower end side of the process chamber 201, where the lower portion of the nozzle 249a which is the upstream side of the DCS gas is disposed. As a result, a larger amount of DCS gas is exhausted from the lower portion inside the process chamber 201, whereby the concentration of the DCS gas becomes uniform in the upper portion, the central portion and the lower portion inside the process chamber 201.

In this way, by performing the exhaust of the gas existing in the process chamber 201 and the supply of a small amount of $N_2$ gas to the process chamber 201 at the same timing, as shown in FIG. 7, the partial pressure of the DCS gas in the lower portion inside the process chamber 201 becomes lower than the partial pressure of the DCS gas in the upper portion inside the process chamber 201 between 6 [s] and 7 [s] of control C.

Further, by exhausting the gas existing in the process chamber 201 from below by the vacuum pump 246, just like the above-described control B, the concentration of the DCS gas becomes uniform in the upper portion, the central portion and the lower portion inside the process chamber 201.

In contrast, in the comparative embodiment, as described above, the $N_2$ gas as a dilution gas for extruding the DCS gas is not used. Therefore, as in the present embodiment described above, the DCS gas is not pushed up to the upper end (distal end) of the vertically extending nozzle 249a. Thus, in the comparative embodiment, the amount of DCS gas supplied into the process chamber 201 at the upper end of the nozzle 249a is smaller than the amount of DCS gas supplied into the process chamber 201 at the central portion and the lower end of the nozzle 249a.

Further, according to the comparative example, as described above, in the steps corresponding to control A, control B and control C of the present embodiment, unlike the present embodiment, the APC valve 244 is closed to stop the exhaust of the gas existing in the process chamber 201. Therefore, the DCS gas supplied to the lower portion inside the process chamber 201 is not exhausted from the inside of the process chamber 201 as in the present embodiment described above. As a result, in the comparative embodiment, the concentration of the DCS gas in the lower portion inside the process chamber 201 is higher than the concentration of the DCS gas in the upper portion inside the process chamber 201.

Figure 6:
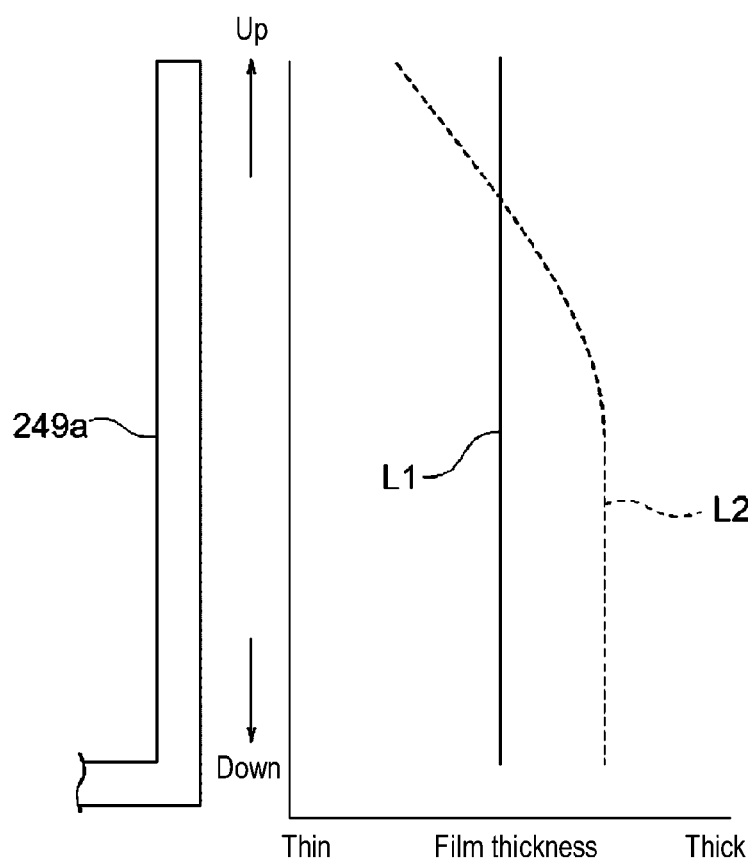
FIG. 6 is a graph for explaining the operation of a method of manufacturing a semiconductor device according to an embodiment of the present disclosure.

In FIG. 6, the relationship between the position in the process chamber 201 and the film thickness of the SiN film formed on the wafer 200 is shown by a graph. Specifically, the vertical axis in FIG. 6 represents the vertical position inside the process chamber 201. The upper end (distal end) of the nozzle is disposed in the upper portion inside the process chamber 201, and the lower end (base end) of the nozzle is disposed in the lower portion inside the process chamber 201. In addition, the horizontal axis in FIG. 6 represents the film thickness of the SiN film formed on the wafer 200. As described above, a plurality of wafers 200 is stacked in the vertical direction within the process chamber 201.

The solid line L1 in the graph indicates the film thickness of the wafer 200 manufactured according to the present embodiment, and the broken line L2 in the graph indicates the film thickness of the wafer 200 manufactured according to the comparative embodiment.

As can be seen from the solid line L1, the film thickness of the SiN film on the wafer 200 manufactured according to the present embodiment is uniform regardless of the position where the wafer 200 is disposed. In contrast, as can be seen from the broken line L2 in the graph, as for the film thickness of the SiN film formed on the wafer 200 manufactured by the comparative embodiment, the film thickness of the wafer 200 disposed in the upper portion inside the process chamber 201 is smaller than the film thickness of the wafer 200 disposed in the lower portion of the process chamber 201.

This is because, as described above, in the comparative embodiment, the amount of the DCS gas supplied into the process chamber 201 at the upper end of the nozzle 249a is smaller than the amount of the DCS gas supplied into the process chamber 201 at the central portion and the lower end of the nozzle 249a. In addition, this is because, in the comparative embodiment, the concentration of the DCS gas in the lower portion inside the process chamber 201 is higher than the concentration of the DCS gas in the upper portion inside the process chamber 201.

In contrast, as described above, in the present embodiment, by supplying the $N_2$ gas for extruding the DCS gas from the nozzle 249a to the process chamber 201, the DCS gas is pushed up by the $N_2$ gas to the upper end (distal end) of the vertically extending nozzle 249a. This suppresses an increase in the flow rate of the DCS gas supplied from the lower portion of the nozzle 249a which is the upstream side of the flow of the DCS gas. Furthermore, by exhausting the gas existing in the process chamber 201 from below by the vacuum pump 246, the concentration of the DCS gas becomes uniform in the respective portions of the upper portion, the central portion and the lower portion inside the process chamber 201.

SUMMARY

As described above, in the present embodiment, as compared with the comparative embodiment, it is possible to suppress inter-wafer variations in the film thickness of the SiN film formed on each of the wafers 200 stacked in the vertical direction.

Further, in the substrate processing apparatus 100 of the present embodiment, there is installed the reservoir part 280 for storing the DCS gas. Therefore, by storing the DCS gas in the reservoir part 280 in advance, it is possible to supply a large amount of DCS gas to the process chamber 201 in a short time.

Further, in the substrate processing apparatus 100 of the present embodiment, there are installed the gas supply pipe 232e, the MFC 241e and the valve 243e. Therefore, by opening the valve 265 and allowing the $N_2$ gas to flow from the gas supply pipe 232e to the nozzle 249a when supplying the DCS gas stored in the reservoir part 280 from the nozzle 249a to the process chamber 201, it is possible for the $N_2$ gas to push up the DCS gas to the upper end (distal end) of the vertically extending nozzle 249a.

Further, in the present embodiment, the supply concentration of the DCS gas can be adjusted by changing the evacuation of the inside of the process chamber 201 and the flow rate of the $N_2$ gas which is an inert gas.

While the present disclosure has been described in detail with respect to a specific embodiment, the present disclosure is not limited to such an embodiment. It will be apparent to those skilled in the art that various other embodiments may be adopted within the scope of the present disclosure. For example, in the above-described embodiment, in the step of control C of the sequence shown in FIG. 4, by opening the valve 243a and opening the valve 265, the DCS gas passed through the reservoir part 280 is supplied from the nozzle 249a to the process chamber 201 at the second precursor gas flow rate lower than the first precursor gas flow rate. However, the valve 265 may be closed to stop the supply of the DCS gas to the process chamber 201, and the DCS gas may be stored in the reservoir part 280. In this case, the DCS gas is supplied to the process chamber 201 only by the step in control B of the sequence shown in FIG. 4. Since the amount of the DCS gas stored in the reservoir part 280 increases, it is possible to supply a large amount of DCS gas to the process chamber 201 in the step of control B.

In the above-described embodiment, the nozzle 249a through which the DCS gas flows is installed in the annular space between the inner wall of the reaction tube 203 and the wafers 200 so as to extend upward in the stacking (arrangement) direction of the wafers 200 (in the vertical direction) from the lower portion to the upper portion of the inner wall of the reaction tube 203. However, the present disclosure is not limited thereto. The nozzle 249a may be installed so as to extend downward in the stacking (arrangement) direction of the wafers 200 (in the vertical direction) from the upper portion to the lower portion of the inner wall of the reaction tube 203. In this case, the exhaust port is provided in the upper portion of the process chamber 201 which is the upstream side of the flow of the DCS gas. In the case where the wafers 200 are horizontally arranged in a vertical posture and supported in multiple stages with the centers thereof aligned with each other (lateral type apparatus), the nozzles 249a are installed so as to extend from one of the left and right ends of the inner wall of the reaction tube 203 (one side) to the other end (the other side opposite to the one side). At that time, the exhaust port is provided at one of the left and right ends of the inner wall of the reaction tube 203 which is the upstream side of the flow of the DCS gas.

In the above-described embodiment, the gas supply pipe 232c, the MFC 241c and the valve 243c are installed in the substrate processing apparatus 100. However, the gas supply pipe 232c, the MFC 241c and the valve 243c may not be particularly provided. In this case, the backflow-preventing $N_2$ gas supplied from the nozzle 249a to the process chamber 201 is supplied from the gas supply pipe 232e.

In the above-described embodiment, the dichlorosilane ($SiH_2Cl_2$, abbreviation: DCS) gas, which is a chlorosilane-based precursor gas, is used as a silicon-based precursor gas. However, other chlorosilane-based precursor gases may be used. In addition, an aminosilane-based precursor gas, a fluorosilane-based precursor gas or the like may be used.

In the above-described embodiment, the SiN film is formed on the wafer 200 by using the $NH_3$ gas, which is a nitrogen-containing gas, as the reaction gas. However, a SiO film may be formed on the wafer 200 by using an $O_2$ gas or the like, which is an oxygen-containing gas, as the reaction gas. A silicon carbide film (SiC film) may be formed on the wafer 200 by using a $C_3H_6$ gas, which is a carbon-containing gas, as the reaction gas.

In the above-described embodiment, the SiN film is formed on the wafer 200. However, other films may be formed. For example, a metal nitride film such as a titanium nitride film (TiN film), a tantalum nitride film (TaN film) or the like may be formed. A metal oxide film such as a hafnium oxide film (HfO film), a zirconium oxide film (ZrO film), an aluminum oxide film (AlO film) or the like may be formed. Other insulating films such as a silicon oxide film and the like may be formed.

In the above-described embodiment, a silicon-based precursor gas is used as the precursor gas. However, it may also be possible to use a titanium-based precursor (for example, titanium tetrachloride), a tantalum-based precursor (for example, tantalum pentachloride), a hafnium-based precursor (for example, tetrakisethylmethylaminohafnium), a zirconium-based precursor (for example, tetrakisethylmethylaminozirconium), an aluminum-based precursor (trimethyl aluminum) or the like.

In the above-described embodiment, the reservoir part 280, the gas supply pipe 232e, the MFC 241e and the valves 243e and 265 are installed in the precursor gas supply system. However, they may be installed in the reaction gas supply system or may be installed in both the precursor gas supply system and the reaction gas supply system.

According to the present disclosure in some embodiments, it is possible to suppress inter-substrate variations in film thickness of films formed on substrates stacked in a vertical direction.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    supplying a precursor gas stored in a reservoir part into a process chamber in which a plurality of substrates are arranged and accommodated by sequentially performing:
        (a) supplying an inert gas at a first inert gas flow rate from a first nozzle extending along an arrangement direction of the plurality of substrates into the process chamber;
        (b) supplying the inert gas at a second inert gas flow rate higher than the first inert gas flow rate from the first nozzle into the process chamber while supplying the precursor gas from the first nozzle into the process chamber; and
        (c) supplying the inert gas at the first inert gas flow rate from the first nozzle into the process chamber in a state in which the process chamber is evacuated from one end side which is an upstream side of a flow of the precursor gas;
    stopping supply of the precursor gas;
    removing the precursor gas remaining in the process chamber;
    supplying a reaction gas from a second nozzle into the process chamber; and
    removing the reaction gas remaining in the process chamber.

2. The method of claim 1, wherein the plurality of substrates are stacked in the process chamber, wherein the precursor gas is caused to flow through the first nozzle from one end to the other end in the act of supplying the precursor gas, and wherein the process chamber is evacuated from the one end side which is the upstream side of the flow of the precursor gas from the first nozzle.

3. The method of claim 2, wherein a supply concentration of the precursor gas is adjusted by changing an evacuation rate of the process chamber and the first inert gas flow rate and the second inert gas flow rate.

4. The method of claim 1, wherein in (a), evacuation of the process chamber is substantially stopped.

5. The method of claim 1, wherein in (b), evacuation of the process chamber is substantially stopped.

6. The method of claim 1, wherein in (a), a valve for evacuating the process chamber is fully closed.

7. The method of claim 1, wherein in (a), a valve for evacuating the process chamber is opened so that F>V when the first inert gas flow rate is F sccm and an evacuation rate of the process chamber per unit time is V sccm.

8. The method of claim 4, wherein in (a), a valve for evacuating the process chamber is opened so that an evacuation rate of the process chamber per unit time is 10% or less of the first inert gas flow rate.

9. A non-transitory computer-readable recording medium storing a program that causes a computer to have a substrate processing apparatus perform a process, the process comprising:

supplying a precursor gas stored in a reservoir part into a process chamber in which a plurality of substrates are arranged and accommodated by sequentially performing:

supplying an inert gas at a first inert gas flow rate from a first nozzle into the process chamber in a state in which evacuation of the process chamber is substantially stopped in a substrate processing apparatus;

supplying the inert gas at a second inert gas flow rate higher than the first inert gas flow rate from the first nozzle into the process chamber while supplying the precursor gas from the first nozzle into the process chamber in a state in which evacuation of the process chamber is substantially stopped; and supplying the inert gas at the first inert gas flow rate from the first nozzle into the process chamber in a state in which the process chamber is evacuated from one end side which is an upstream side of a flow of the precursor gas, and stopping supply of the precursor gas;

removing the precursor gas remaining in the process chamber;

supplying a reaction gas from a second nozzle into the process chamber; and removing the reaction gas remaining in the process chamber.

* * * * *